United States Patent
Park

(10) Patent No.: US 12,171,121 B2
(45) Date of Patent: Dec. 17, 2024

(54) TRANSPARENT DISPLAY DEVICE CAPABLE OF MINIMIZING SIZE OF NON-TRANSMISSIVE AREA

(71) Applicant: LG Display Co., Ltd., Seoul (KR)

(72) Inventor: JaeHee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 445 days.

(21) Appl. No.: 17/547,826

(22) Filed: Dec. 10, 2021

(65) Prior Publication Data

US 2022/0190095 A1 Jun. 16, 2022

(30) Foreign Application Priority Data

Dec. 11, 2020 (KR) .................... 10-2020-0173100

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC ............. H10K 59/131; H10K 59/1213; H10K 59/1216; H10K 59/351; H01L 23/642; H01L 27/124; H01L 27/1255
USPC ........................................................ 257/40
See application file for complete search history.

(56) References Cited

U.S. PATENT DOCUMENTS

| | | | |
|---|---|---|---|
| 9,466,658 B2 | 10/2016 | Chung et al. | |
| 9,660,001 B2 | 5/2017 | Kim | |
| 2013/0105800 A1* | 5/2013 | Chang | H01L 27/1255 438/34 |
| 2015/0228223 A1* | 8/2015 | Park | H10K 59/353 345/77 |

FOREIGN PATENT DOCUMENTS

KR 10-2015-0140498 A 12/2015
KR 10-2016-0084936 A 7/2016

* cited by examiner

*Primary Examiner* — Nduka E Ojeh
*Assistant Examiner* — Laura M Dykes
(74) *Attorney, Agent, or Firm* — Seed IP Law Group LLP

(57) ABSTRACT

A transparent display device reducing or minimizing the size of a non-transmissive area is provided. The transparent display device includes a substrate having thereon transmissive areas and a plurality of subpixels in a non-transmissive area disposed between the transmissive areas, a first signal line extended between the transmissive areas in a first direction, a second signal line extended between the transmissive areas in a second direction, and a capacitor including a first capacitor pattern portion longitudinally provided between the first signal line and the transmissive area in the first direction and a second capacitor pattern portion extended from one end of the first capacitor pattern portion and longitudinally provided between the second signal line and the transmissive area in the second direction.

21 Claims, 7 Drawing Sheets

TRANSPARENT DISPLAY DEVICE CAPABLE OF MINIMIZING SIZE OF NON-TRANSMISSIVE AREA

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area.

In a transparent display device, a plurality of circuits and a plurality of signal lines may be disposed in a vertical or horizontal direction in a non-transmissive area.

BRIEF SUMMARY

The inventors have recognized that in the transparent display device, in order to improve light transmittance, it is important to efficiently dispose the plurality of circuits and the plurality of signal lines to reduce the non-transmissive area and increase the transmissive area. The present disclosure has been made in view of one or more technical problems in the related art including the above identified problem. One or more embodiments of the present disclosure provide a transparent display device that may reduce or minimize a size of a non-transmissive area.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a substrate provided with transmissive areas and a plurality of subpixels in non-transmissive areas provided between the transmissive areas, a first signal line extended between the transmissive areas in a first direction, a second signal line extended between the transmissive areas in a second direction, and a capacitor including a first capacitor pattern portion longitudinally provided between the first signal line and the transmissive area in the first direction and a second capacitor pattern portion extended from one end of the first capacitor pattern portion and longitudinally provided between the second signal line and the transmissive area in the second direction.

In accordance with another aspect of the present disclosure, the above and other technical benefits can be accomplished by the provision of a transparent display device comprising a substrate provided with transmissive areas and a non-transmissive area disposed between the transmissive areas, a first signal line extended from the non-transmissive area in a first direction, a second signal line extended from the non-transmissive area in a second direction, and a capacitor provided between the first signal line and the transmissive area and between the second signal line and the transmissive area, the capacitor including an L-shape.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
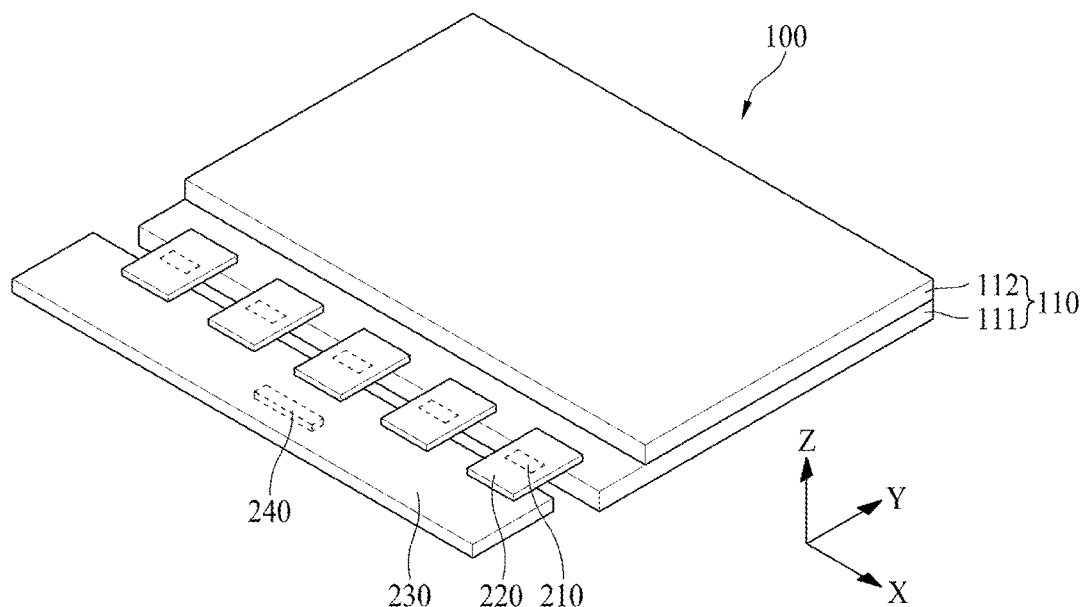
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
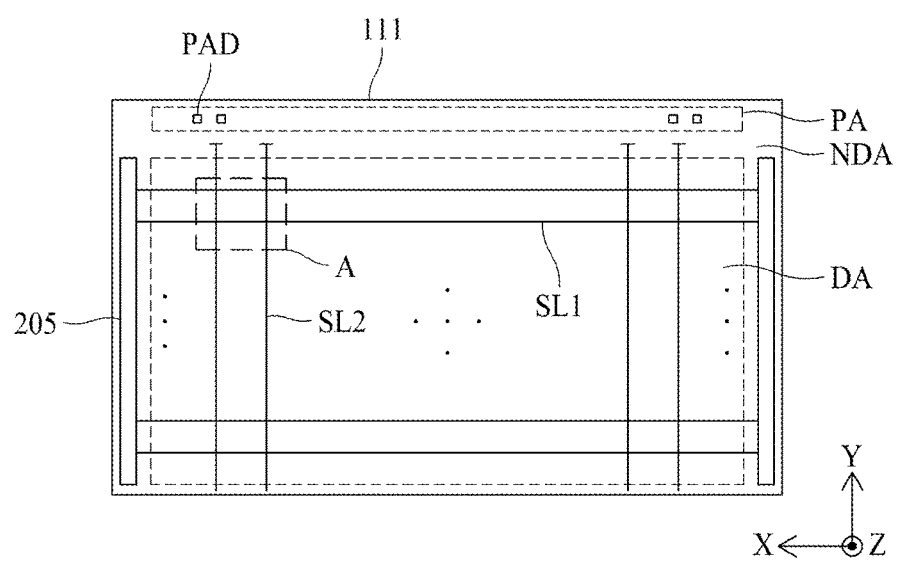
FIG. 2 is a schematic plane view illustrating a transparent display panel according to one embodiment of the present disclosure.
Figure 3:
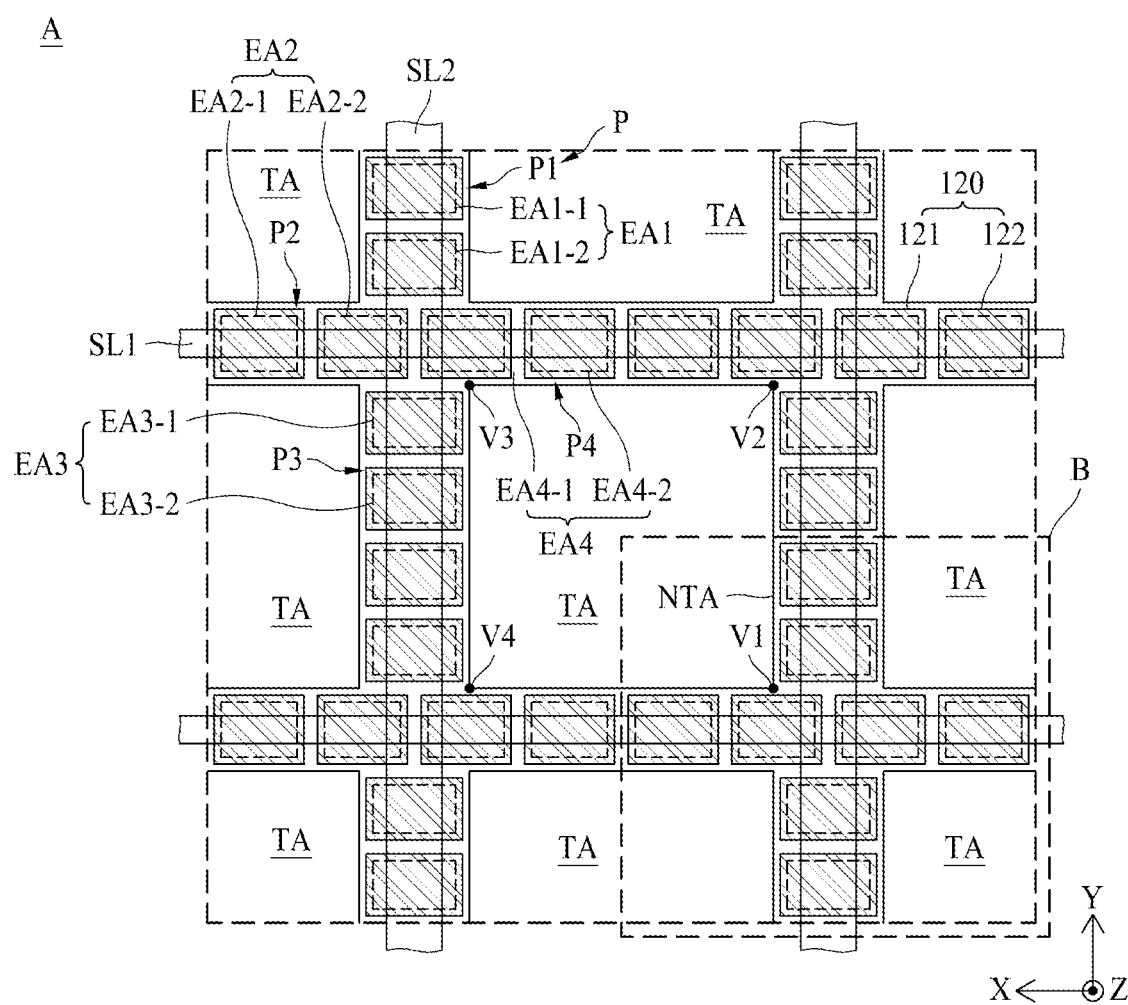
FIG. 3 is an enlarged view illustrating an area A of FIG. 2.

FIG. 2 is a schematic plane view illustrating a transparent display panel according to one embodiment of the present disclosure, and FIG. 3 is an enlarged view illustrating an area A of FIG. 2.

Referring to FIG. 2 and FIG. 3, a transparent display panel 110 may include into a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SL and supplies scan signals to the scan lines SL. The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be provided in both side of the display area DA of the transparent display panel 110, but these scan drivers are not limited thereto. The scan driver 205 may be provided only in one side of the display area DA of the transparent display panel 110.

The display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α %, for example, about 90%, and the non-transmissive area NTA may be an area where light transmittance is smaller than β %, for example, about 50%. At this time, α is greater than β. A user may view an object or background arranged over a rear surface of the transparent display panel 110 due to the transmissive area TA.

The non-transmissive area NTA may include a plurality of pixels P, and a plurality of first signal lines SL1 and a plurality of second signal lines SL2 to supply signals to each of a plurality of pixels P.

The plurality of first signal lines SL1 may be extended in a first direction (e.g., X-axis direction). The plurality of first signal lines SL1 may cross the plurality of second signal lines SL1. For example, each of the plurality of first signal lines SL1 may include at least one scan line.

Hereinafter, when the first signal line SL1 includes a plurality of lines, one first signal line SL1 may refer to a signal line group including a plurality of lines. For example, when the first signal line SL1 includes two scan lines, one first signal line SL1 may refer to a signal line group including two scan lines.

The plurality of second signal lines SL2 may be extended in a second direction (e.g., Y-axis direction). For example, each of the plurality of second signal lines SL2 may include at least one of at least one data line, a pixel power line, a reference line, or a common power line.

Hereinafter, when the second signal line SL2 includes a plurality of lines, one second signal line SL2 may refer to a signal line group including a plurality of lines. For example, when the second signal line SL2 includes two data lines, a pixel power line, a common power line, and a reference line, one second signal line SL2 may refer to a signal line group including two data lines, a pixel power line, a common power line, and a reference line.

A transmissive area TA may be disposed between adjacent first signal lines SL1. In addition, a transmissive area TA may be disposed between adjacent second signal lines SL2. That is, the transmissive area TA may be surrounded by two first signal lines SL1 and two second signal lines SL2. For example, the transmissive area TA may have a rectangular shape surrounded by two first signal lines SL1 and two second signal lines SL2. The transmissive area TA may have a rectangular shape including four corners. The transmissive area TA may include a first corner V1, a second corner V2 facing the first corner V1 in the second direction, a third corner V3 facing the second corner V2 in the first direction, and a fourth corner V4 facing the first corner V1 in the first direction.

Pixels P may be provided to overlap at least one of the first signal line SL1 and the second signal line SL2, thereby emitting selected (or predetermined) light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a green color. The second subpixel P2 may include a second emission area EA2 emitting light of a red color. The third subpixel P3 may include a third emission area EA3 emitting light of a white color. The fourth subpixel P4 may include a fourth emission area EA4 emitting light of a blue color. However, the emission areas are not limited to this example. Each of the pixels P may further include a subpixel emitting light of a color other than red, green, blue and white. Also, the arrangement order of the subpixels P1, P2 and P3 may be changed in various ways.

Meanwhile, light emission areas EA1, EA2, EA3 and EA4 respectively provided in a plurality of subpixels P1, P2, P3 and P4 may include light emission areas divided into a plurality of areas. In detail, the first light emission area EA1 provided in the first subpixel P1 may include two divided areas, that is, a first divided light emission area EA1-1 and a second divided light emission area EA1-2. The second light emission area EA2 provided in the second subpixel P2 may include two divided areas, that is, a first divided light emission area EA2-1 and a second divided light emission area EA2-2. The third light emission area EA3 provided in the third subpixel P3 may include two divided areas, that is, a first divided light emission area EA3-1 and a second divided light emission area EA3-2. The fourth light emission area EA4 provided in the fourth subpixel P4 may include two divided areas, that is, a first divided light emission area EA4-1 and a second divided light emission area EA4-2.

Hereinafter, for convenience of description, the description will be given based on that a first subpixel P1 is a green subpixel emitting green light, a second subpixel P2 is a red subpixel emitting red light, a third subpixel P3 is a white subpixel emitting blue light, and a fourth subpixel P4 is a blue subpixel emitting white light.

The second subpixel P2 and the fourth subpixel P4 may be provided to overlap at least a part of the first signal line SL1, and may alternately be disposed along the first signal line SL1.

The first subpixel P1 and the third subpixel P3 may be provided to overlap at least a part of the second signal line SL2, and may alternately be disposed along the second signal line SL2.

As shown in FIG. 3, the second subpixel P2 and the fourth subpixel P4 may be provided in an area where at least a part of the first signal line SL1 and at least a part of the second signal line SL2 cross or overlap each other, but are not limited thereto.

In another embodiment, the first subpixel P1 and the third subpixel P3 may be disposed in an area where at least a part of the first signal line SL1 and at least a part of the second signal line SL2 cross or overlap each other. In this case, the second subpixel P2 and the fourth subpixel P4 may be spaced apart from each other in the area, in which at least a part of the first signal line SL1 and at least a part of the second signal line SL2 cross or overlap each other, with the first and third subpixels P1 and P3 interposed therebetween.

Each of the first subpixel P1, the second subpixel P2, the third subpixel P3 and the fourth subpixel P4 may include a circuit element, which includes a capacitor, a thin film transistor, and the like, and a light emitting diode. The thin film transistor may include a switching transistor, a sensing transistor, and a driving transistor.

The switching transistor is switched in accordance with scan signals supplied to the scan lines to supply data voltages supplied from the data lines to the driving transistor TR.

The sensing transistor serves to sense a threshold voltage deviation of the driving transistor TR, which causes deterioration of picture quality.

The driving transistor is switched in accordance with a data voltage supplied from a switching thin film transistor to generate a data current from a power source supplied from the pixel power line, thereby serving to supply the generated data current to a first electrode of a subpixel. The driving transistor includes an active layer, a gate electrode, a source electrode and a drain electrode.

The capacitor Cst serves to maintain the data voltage supplied to the driving transistor TR for one frame. The capacitor Cst may include two capacitor electrodes, but is not limited thereto. In one embodiment, the capacitor Cst may include three capacitor electrodes.

The transparent display panel 110 according to one embodiment of the present disclosure is characterized in that the capacitor includes an L-shape. In detail, the capacitor according to one embodiment of the present disclosure may include a first capacitor pattern portion longitudinally provided between the first signal line SL1 and the transmissive area TA in the first direction, and a second capacitor pattern portion extended from one end of the first capacitor pattern portion and longitudinally provided between the second signal line SL2 and the transmissive area TA in the second direction.

Hereinafter, the L-shaped capacitor, the driving transistor, the plurality of signal lines, and the light emitting diode will be described in more detail with reference to FIGS. 4 and 5.

Figure 4:
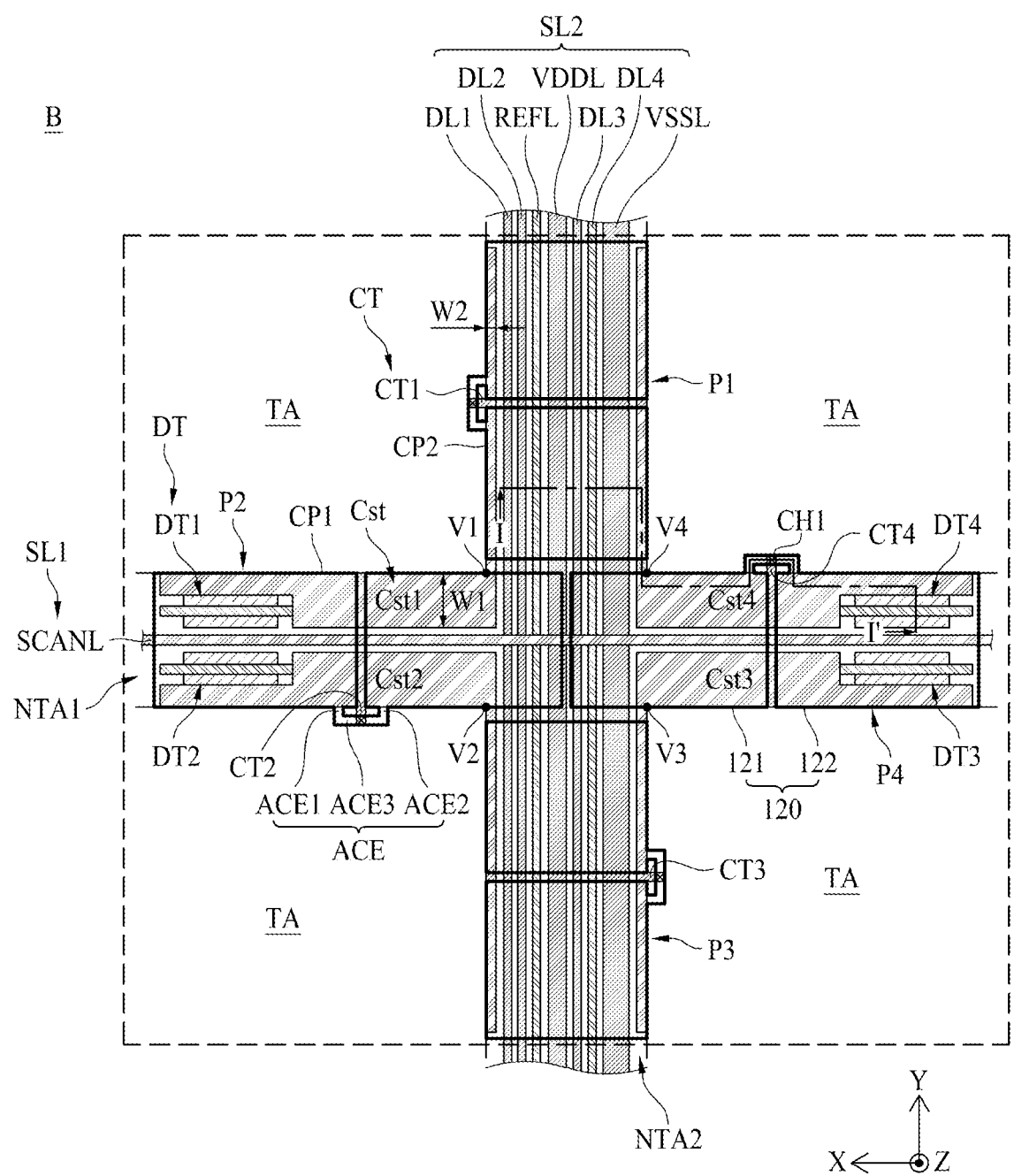
FIG. 4 is an enlarged view illustrating an area B of FIG. 3.
Figure 5:
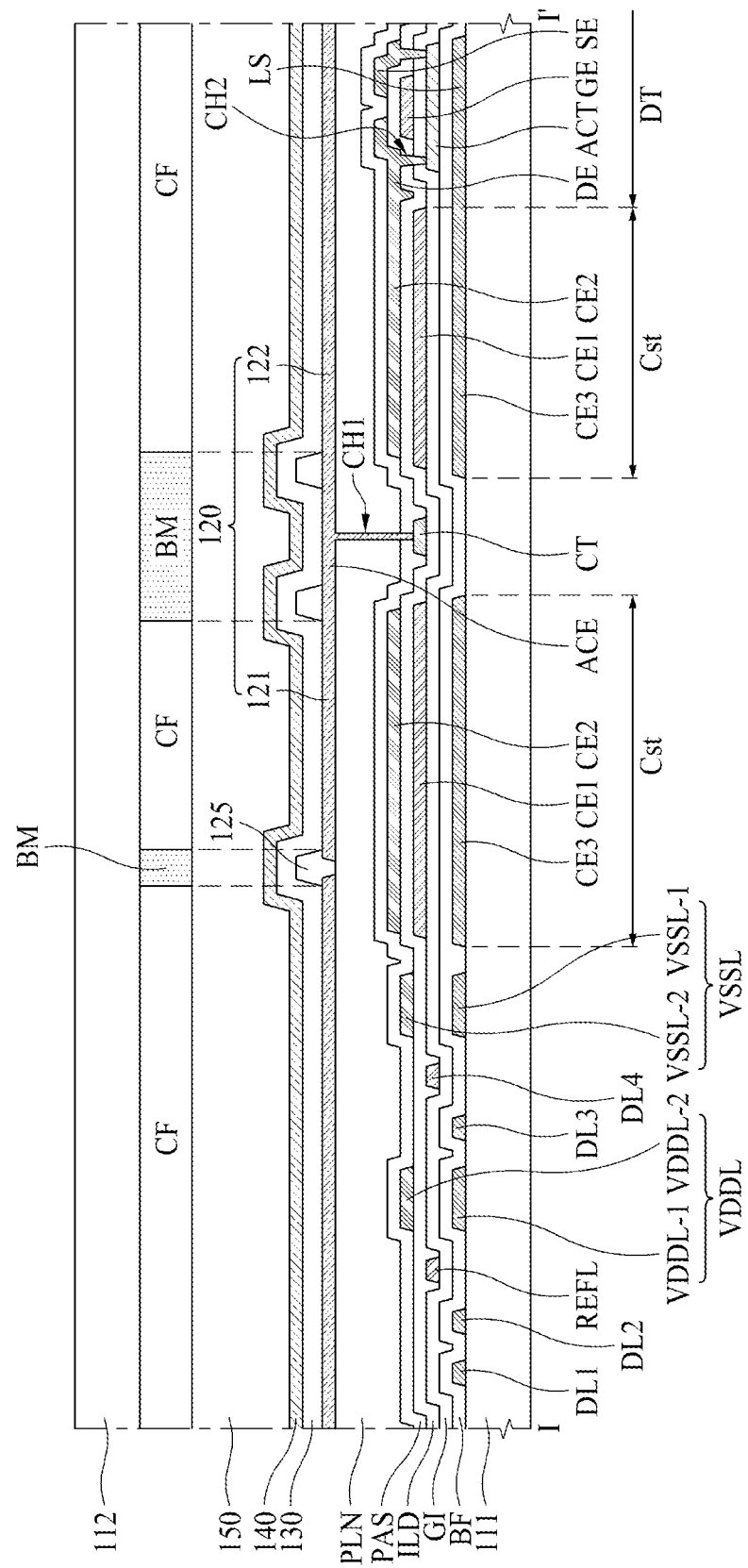
FIG. 5 is a cross-sectional view taken along line I-I' of FIG. 4.
Figure 6:
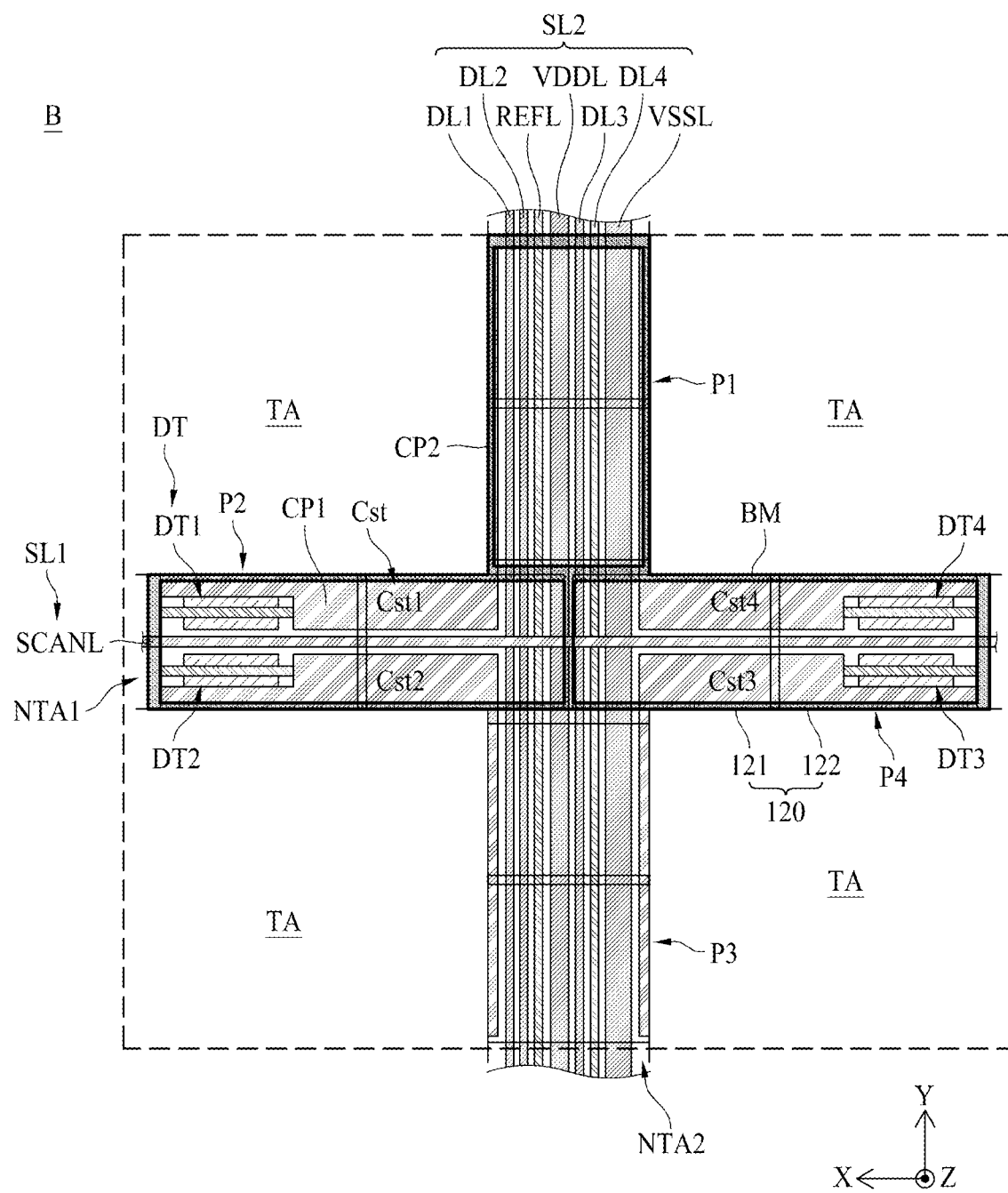
FIG. 6 is a view illustrating an area provided with a black matrix in FIG. 4.

FIG. 4 is an enlarged view illustrating an area B of FIG. 3, FIG. 5 is a cross-sectional view taken along line I-I' of FIG. 4, and FIG. 6 is a view illustrating an area provided with a black matrix in FIG. 4.

Referring to FIGS. 4 to 6, as an example, the first signal line SL1 extended in the first direction (e.g., X-axis direction) may be disposed in the non-transmissive area NTA, and may include a scan line but is not limited thereto. As another example, the first signal line SL1 may include a plurality of scan lines SCANL, for example, two scan lines SCANL.

For example, the second signal line SL2 extended in the second direction (e.g., Y-axis direction) may be disposed in the non-transmissive area NTA, and may include, but is not limited to, a first data line DL1, a second data line DL2, a pixel power line VDDL, a reference line REFL, a common power line VSSL, a third data line DL3, and a fourth data line DL4. For another example, the second signal line SL2 may only include two data lines, a pixel power line VDDL, a reference line REFL, and a common power line VSSL.

The scan line SCANL may supply a scan signal to the subpixels P1, P2, P3 and P4 provided in the display area DA.

The reference line REFL may supply a reference voltage (or an initialization voltage or a sensing voltage) to the driving transistor DT of each of the subpixels P1, P2, P3 and P4 provided in the display area DA.

Each of the first to fourth data lines DL1, DL2, DL3 and DL4 may supply a data voltage to at least one of the subpixels P1, P2, P3 and P4 provided in the display area DA. For example, the first data line DL1 may supply a first data voltage to a first driving transistor DT1 of the first subpixel P1, the second data line DL2 may supply a second data voltage to a second driving transistor DT2 of the second subpixel P2, the third data line DL3 may supply a third data voltage to a third driving transistor DT3 of the third subpixel P3, and the fourth data line DL4 may supply a fourth data voltage to a fourth driving transistor DT4 of the fourth subpixel P4.

The pixel power line VDDL may supply a first power source to the first electrode 120 of each of the subpixels P1, P2, P3 and P4. The common power line VSSL may supply a second power source to the second electrode 140 of each of the subpixels P1, P2, P3 and P4.

When the second signal line SL2 includes the pixel power line VDDL and the common power line VSSL, since a higher voltage is applied to the pixel power line VDDL and the common power line VSSL than the other signal lines, it is beneficial that the pixel power line VDDL and the common power line VSSL have a wider area than the other signal lines. Each of the pixel power line VDDL and the common power line VSSL may be formed as a double layer to make sure of a wide area. For example, the pixel power line VDDL may include a first pixel power line VDDL-1 and a second pixel power line VDDL-2. In addition, the common power line VSSL may include a first common power line VSSL-1 and a second common power line VSSL-2.

The transmissive area TA may be disposed between adjacent first signal lines SL1 and between adjacent second signal lines SL2.

Each of the plurality of subpixels P1, P2, P3 and P4 may be disposed in the non-transmissive area NTA to overlap at least one of the first signal line SL1 or the second signal line SL2. For example, the second subpixel P2 and the fourth subpixel P4 may be provided to overlap at least a part of the first signal line SL1, and may alternately be disposed along the first signal line SL1. The first subpixel P1 and the third subpixel P3 may be provided to overlap at least a part of the second signal line SL2, and may alternately be disposed along the second signal line SL2. Each of the plurality of subpixels P1, P2, P3 and P4 may be provided with a light emitting diode.

The driving transistor DT and the capacitor Cst may be disposed between the transmissive area TA and the first signal line SL1 or between the transmissive area TA and the second signal line SL2, and may be connected with the light emitting diode of each of the plurality of subpixels P1, P2, P3 and P4. The driving transistor DT includes an active layer ACT, a gate electrode GE, a source electrode SE, and a drain electrode DE. The capacitor Cst may include, but is not limited to, a first capacitor electrode CE1, a second capacitor electrode CE2, and a third capacitor electrode CE3. In another embodiment, the capacitor Cst may only include the first capacitor electrode CE1 and the second capacitor electrode CE2.

In detail, the active layer ACT may be provided over a first substrate 111. The active layer ACT may be formed of a silicon-based semiconductor material or an oxide-based semiconductor material.

As shown in FIG. 5, a light-shielding layer LS for shielding external light entering the active layer ACT may be disposed between the active layer ACT and the first substrate 111. The light-shielding layer LS may be formed of a material having conductivity, and may be formed of a single layer or multiple layers made of one of molybdenum (Mo), aluminum (Al), chromium (Cr), gold (Au), titanium (Ti), nickel (Ni), neodymium (Nd) and copper (Cu), or their alloy. In this case, a buffer layer BF may be provided between the light-shielding layer LS and the active layer ACT.

In addition, the third capacitor electrode CE3 and at least one of the plurality of signal lines may be provided on the same layer as the light-shielding layer LS. For example, the third capacitor electrode CE3, the first data line DL1, the second data line DL2, the first pixel power line VDDL-1, the third data line DL3, and the first common power line VSSL-1 may be formed of the same material as that of the light-shielding layer LS on the same layer as the light-shielding layer LS.

A gate insulating layer GI may be provided over the active layer ACT. The gate insulating layer GI may be formed of an inorganic layer, for example, a silicon oxide film (SiOx), a silicon nitride film (SiNx), or a multi-film thereof.

The gate electrode GE may be provided over the gate insulating layer GI. The gate electrode GE may be formed of a single layer or multiple layers made of one of molybdenum (Mo), aluminum (Al), chromium (Cr), gold (Au), titanium (Ti), nickel (Ni), neodymium (Nd) and copper (Cu), or their alloy.

In addition, the first capacitor electrode CE1 1 and at least one of the plurality of signal lines may be formed on the same layer as the gate electrode GE. For example, the first capacitor electrode CE1, the reference line REFL, and the fourth data line DL4 may be formed of the same material as that of the gate electrode GE on the same layer as the gate electrode GE.

In FIG. 5, the reference line REFL and the fourth data line DL4 are provided on the same layer as the gate electrode GE, and the first data line DL1, the second data line DL2, the first pixel power line VDD1-1, the third data line DL3, and the first common power line VSSL-1 are provided on the same layer as the light-shielding layer LS, but are not limited thereto. Each of the first data line DL1, the second data line DL2, the reference line REFL, the first pixel power line VDD1-1, the first common power line VSSL-1, the third data line DL3, and the fourth data line DL4 may be formed on the same layer as any one of the light-shielding layer LS, the active layer ACT, the gate electrode GE, the source electrode SE, and the drain electrode DE.

In the transparent display panel 110, it is beneficial to reduce a size of the non-transmissive area NTA and increase a size of the transmissive area TA in order to make sure of high light transmittance. Therefore, the transparent display panel 110 may improve light transmittance by reducing or minimizing a width of the second signal line SL2 provided in the non-transmissive area NTA.

In the transparent display panel 110 according to one embodiment of the present disclosure, in order to reduce or minimize the width of the second signal line SL2, the plurality of signal lines included in the second signal line SL2 may not be formed in one layer, and may be distributed to the plurality of layers as shown in FIG. 5. Therefore, the transparent display panel 110 according to one embodiment of the present disclosure may reduce or minimize the width of the second signal line SL2 and at the same time reduce or minimize parasitic capacitance between adjacent signal lines.

Meanwhile, in the transparent display panel 110 according to one embodiment of the present disclosure, a signal line disposed at the outermost portion of the plurality of signal lines included in the second signal line SL2 may be provided on the same layer as the light-shielding layer LS. For example, when the first data line DL1 among the plurality of signal lines included in the second signal line SL2 is disposed at the outermost portion, the first data line DL1 may be formed on the same layer as the light-shielding layer LS.

Particles may occur on the upper surface of the signal line during the manufacturing process. When another signal line is deposited on the signal line, in which the particles occur, with one insulating layer interposed therebetween, a short may occur between the signal line in which particles occur and another signal line. Particularly, when a short occurs between the second capacitor electrode CE2 of the capacitor Cst electrically connected with the driving transistor DT and the signal line, a problem may occur in that a subpixel connected with the corresponding driving transistor DT and the capacitor Cst may not emit light.

In the transparent display panel 110 according to one embodiment of the present disclosure, the signal line disposed to be adjacent to the capacitor Cst, especially the second capacitor pattern portion CP2 of the capacitor Cst may be provided in the light-shielding layer LS to prevent a short from occurring between the capacitor Cst and the signal lines due to particles. Since a plurality of insulating layers BF, GI and ILD are provided between the second capacitor electrode CE2 of the capacitor Cst and the light-shielding layer LS, a short may be prevented from occurring between the signal line and the second capacitor electrode CE2 of the capacitor Cst even though particles occur on the upper surface of the signal line provided in the light-shielding layer LS.

In FIG. 4 and FIG. 5, the first data line DL1, the second data line DL2, the reference line REFL, the pixel power line VDDL, the third data line DL3, the fourth data line DL4, and the common power line VSSL are disposed in due order, but are not limited thereto. The arrangement order of the signal lines included in the second signal line SL2 may be changed in various ways.

An interlayer dielectric layer ILD may be provided over the gate electrode GE. The interlayer dielectric layer ILD may be formed of an inorganic layer, for example, a silicon oxide film (SiOx), a silicon nitride film (SiNx), or a multi-film thereof.

The source electrode SE and the drain electrode DE may be provided over the interlayer dielectric layer ILD. The source electrode SE or the drain electrode DE may be connected to the active layer ACT through a second contact hole CH2 that passes through the gate insulating layer GI and the interlayer dielectric layers ILD.

The source electrode SE and the drain electrode DE may be formed of a single layer or multiple layers made of one of molybdenum (Mo), aluminum (Al), chromium (Cr), gold (Au), titanium (Ti), nickel (Ni), neodymium (Nd) and copper (Cu), or their alloy.

In addition, the second capacitor electrode CE2 and at least one of the plurality of signal lines may be provided on the same layer as the source electrode SE and the drain electrode DE. For example, the second capacitor electrode CE2, the second pixel power line VDDL-2, and the second common power line VSSL-2 may be formed of the same material as that of the source electrode SE and the drain electrode DE on the same layer as the source electrode SE and the drain electrode DE.

Particularly, the second capacitor electrode CE2 of the capacitor Cst may be extended from the source electrode SE or the drain electrode DE. Therefore, the second capacitor electrode CE2 of the capacitor Cst may electrically be connected with the source electrode SE or the drain electrode DE of the driving transistor DT.

A passivation layer PAS may be provided over the source electrode SE, the drain electrode DE for protecting the driving transistor DT and the capacitor Cst. A planarization layer PLN may be provided over the passivation layer PAS to planarize a step difference caused by the driving transistor DT and the capacitor Cst. The planarization layer PLN may be formed of an organic layer, for example, acryl resin, epoxy resin, phenolic resin, polyamide resin, polyimide resin, etc.

Light emitting diodes, which are comprised of the first electrode 120, an organic light emitting layer 130, and a second electrode 140, and a bank 125 are provided over the planarization layer PLN.

A first electrode 120 may be provided over a planarization layer PLN and connected with the driving transistor DT. The first electrode 120 may be provided for each of the subpixels P1, P2, P3 and P4. One first electrode 120 may be provided in the first subpixel P1, another first electrode 120 may be provided in the second subpixel P2, the other first electrode 120 may be provide in the third subpixel P3, and the other first electrode 120 may be provided in the fourth subpixel P4. The first electrode 120 is not provided in the transmissive area TA.

The first electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO, MoTi alloy and a deposited structure (ITO/MoTi alloy/ITO) of MoTi alloy and ITO. The Ag alloy may be an alloy of silver (Ag), palladium (Pb), and Copper (Cu). The MoTi alloy may be an alloy of molybdenum (Mo) and titanium (Ti). The first electrode 120 may be an anode electrode.

The first electrode 120 provided in each of the plurality of subpixels P1, P2, P3 and P4 may include a plurality of first electrodes 120. For example, the first electrode 120 provided in each of the plurality of subpixels P1, P2, P3 and P4 may include a first divided electrode 121, a second divided electrode 122, and a connection electrode ACE.

The first divided electrode 121 may be disposed over first divided light emission areas EA1-1, EA2-1, EA3-1 and EA4-1, and the second divided electrode 122 may be disposed over second divided light emission areas EA1-2, EA2-2, EA3-2 and EA4-2. The first and second divided electrodes 121 and 122 may be spaced apart from each other on the same layer.

The connection electrode ACE may connect the first divided electrode 121 with the second divided electrode 122. In detail, the connection electrode ACE may include a first connection portion ACE1, a second connection portion ACE2, and a third connection portion ACE3 as shown in FIG. 4.

The first connection portion ACE1 may be extended from the first divided electrode 121 as much as a selected (or predetermined) length in a direction of the transmissive area TA. The second connection portion ACE2 may be extended from the second divided electrode 122 as much as a selected (or predetermined) length in the direction of the transmissive area TA. The third connection portion ACE3 may connect one end of the first connection portion ACE1 with one end of the second connection portion ACE2. Therefore, the first divided electrode 121 may electrically be connected with the second divided electrode 122 through the connection electrode ACE.

The first connection portion ACE1, the second connection portion ACE2, and the third connection portion ACE3 may be formed on the same layer as the first divided electrode 121 and the second divided electrode 122. The area in which the first connection portion ACE1, the second connection portion ACE2, and the third connection portion ACE3 are provided may be the non-transmissive area NTA. The transmissive area TA may be provided between the first connection portion ACE1 and the second connection portion ACE2.

The first electrode 120 may electrically be connected with the second capacitor electrode CE2 of the capacitor Cst through a contact electrode CT. In detail, the contact electrode CT may be protruded from the second capacitor electrode CE2 of the capacitor Cst in the direction of the transmissive area TA, and a portion thereof may overlap the third connection portion ACE3 of the connection electrode ACE. The third connection portion ACE3 of the connection electrode ACE may be connected to the contact electrode CT through a first contact hole CH1 in an area overlapped with the contact electrode CT. Since the second capacitor electrode CE2 of the capacitor Cst is electrically connected with the source electrode SE or the drain electrode DE of the driving transistor DT, the first electrode 120 may electrically be connected with the source electrode SE or the drain electrode DE of the driving transistor DT through the connection electrode ACE, the contact electrode CT, and the second capacitor electrode CE2 of the capacitor Cst.

The transparent display panel 110 according to one embodiment of the present disclosure may repair the contact electrode CT by laser cutting when a particular subpixel operates in error by the driving transistor DT.

In addition, in the transparent display panel 110 according to one embodiment of the present disclosure, when any one of the first divided electrode 121 and the second divided electrode 122 operates in error due to particles that may occur during the process, at least one of the first and second connection portions ACE1 and ACE2 of the connection electrode ACE may be repaired by laser cutting.

For example, in the transparent display panel 110 according to one embodiment of the present disclosure, when a short occurs between the first electrode 120 and the second electrode 140 in an area, in which the first divided electrode 121 is provided, due to particles, the first connection portion ACE1 may be repaired by laser cutting.

For another example, in the transparent display panel 110 according to one embodiment of the present disclosure, when a short occurs between the first electrode 120 and the second electrode 140 in an area, in which the second divided electrode 122 is provided, due to particles, the second connection portion ACE2 may be repaired by laser cutting.

In the transparent display panel 110 according to one embodiment of the present disclosure, even though a dark spot occurs due to particles, the corresponding divided electrode of the plurality of divided electrodes 121 and 122 may be short-circuited through laser cutting, whereby light loss caused by occurrence of the dark spot may be reduced.

A bank 125 may be provided over a planarization layer PLN. In addition, the bank 125 may be provided between the first electrodes 120. The bank 125 may be provided to cover or at least partially cover edges of each of the first electrodes 120 and expose a portion of each of the first electrodes 120. Therefore, the bank 125 may prevent light emission efficiency from being deteriorated by a current concentrated on each end of the first electrodes 120.

The bank 125 may define the light emission areas EA1-1, EA1-2, EA2-1, EA2-2, EA3-1, EA3-2, EA4-1 and EA4-2 of each of the subpixels P1, P2, P3 and P4 in the non-transmissive area NTA. The light emission areas EA1-1, EA1-2, EA2-1, EA2-2, EA3-1, EA3-2, EA4-1 and EA4-2 of each of the subpixels P1, P2, P3 and P4 refer to areas in which the first electrode 120, the organic light emitting layer 130, and the second electrode 140 are sequentially deposited so that holes from the first electrode 120 and electrons from the second electrode 140 are combined with each other in the organic light emitting layer 130 to emit light. In this case, since the area in which the bank 125 is provided in the non-transmissive area NTA does not emit light, the area may be a non-light emission area, and the area in which the bank 125 is not provided and the first electrode 120 is exposed may be the light emission areas EA1-1, EA1-2, EA2-1, EA2-2, EA3-1, EA3-2, EA4-1 and EA4-2.

The bank 125 may be formed of an organic layer, for example, acryl resin, epoxy resin, phenolic resin, polyamide resin, polyimide resin, etc.

The organic light emitting layer 130 may be provided over the first electrode 120. The organic light emitting layer 130 may include a hole transporting layer, a light emitting layer, and an electron transporting layer. In this case, if a voltage is applied to the first electrode 120 and the second electrode 140, holes and electrons move to the light emitting layer through the hole transporting layer and the electron transporting layer, respectively, and are combined with each other in the light emitting layer to emit light.

In one embodiment, the organic light emitting layer 130 may be a common layer commonly provided for the subpixels P1, P2, P3 and P4. For example, the organic light emitting layer 130 may be a white light emitting layer emitting white light.

In another embodiment, the organic light emitting layer 130 may include light emitting layers provided per subpixels P1, P2, P3 and P4. For example, a green light emitting layer emitting green light may be provided in the first subpixel P1, a red light emitting layer emitting red light may be provided in the second subpixel P2, a white light emitting layer emitting white light may be provided in the third subpixel P3, and a blue light emitting layer emitting blue light may be provided in the fourth subpixel P4. In this case, the light emitting layers of the organic light emitting layer 130 are not provided in the transmissive area TA.

The second electrode 140 may be provided over the organic light emitting layer 130 and the bank 125. The second electrode 140 may be provided in the transmissive area TA as well as the non-transmissive area NTA that includes the emission area EA, but is not limited thereto. The second electrode 140 may be provided only in the non-transmissive area NTA that includes the emission area EA, but may not be provided in the transmissive area TA to improve transmittance.

The second electrode 140 may be a common layer commonly provided in the subpixels P1, P2, P3 and P4 to apply the same voltage. The second electrode 140 may be formed of a conductive material that may transmit light. For example, the second electrode 140 may be formed of a low resistance metal material, for example, Ag, or alloy of Mg and Ag. The second electrode 140 may be a cathode electrode.

An encapsulation layer 150 may be provided over the light emitting diodes. The encapsulation layer 150 may be provided over the second electrode 140 to overlay the second electrode 140. The encapsulation layer 150 serves to prevent oxygen or water from being permeated into the organic light emitting layer 130 and the second electrode 140. Accordingly, in some embodiments, the encapsulation layer 150 may include at least one inorganic layer and at least one organic layer.

Meanwhile, although not shown in FIG. 5 and FIG. 6, a capping layer may additionally be provided between the second electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels P1, P2, P3 and P4. In detail, the color filter CF may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA4 of the fourth subpixel P4, and may be a blue color filter that transmits blue light.

The color filter CF may further include a fourth color filter disposed to correspond to the emission area EA3 of the third subpixel P3. In this case, the fourth color filter may be made of a transparent organic material that transmits white light.

Meanwhile, a black matrix BM may be provided between color filters CF and between the color filter CF and the transmissive area TA. In detail, the black matrix BM may be disposed between the subpixels P1, P2, P3 and P4 to prevent a color mixture from occurring between adjacent subpixels P1, P2, P3 and P4. Accordingly, in some embodiments, the black matrix BM may be provided between the color filters CF. As shown in FIG. 6, the black matrix BM may be provided between a second color filter of the second subpixel P2 and a fourth color filter of the fourth subpixel P4, which are alternately disposed along the first signal line SL1. The black matrix BM may be provided between a first color filter of the first subpixel P1 and a third color filter of the third subpixel P3, which are alternately disposed along the second signal line SL2.

In addition, the black matrix BM may be disposed between the subpixels P1, P2, P3 and P4 and the transmissive area TA to prevent light emitted from each of the subpixels P1, P2, P3 and P4 from being visible to another color depending on a viewing angle. For example, light emitted from a green subpixel may be viewed as white light at a side.

In the transparent display panel 110 according to one embodiment of the present disclosure, the black matrix BM may be provided between the subpixels P1, P2, P3 and P4 and the transmissive area TA so that light emitted from the subpixels P1, P2, P3 and P4 may not move to a side, for example, the transmissive area TA. However, when the black matrix BM is provided between the subpixels P1, P2, P3 and P4 and the transmissive area TA, the size of the transmissive area TA is reduced, whereby light transmittance may be reduced. In the transparent display panel 110 according to one embodiment of the present disclosure, as shown in FIG. 6, the black matrix BM may not be provided between the third subpixel P3, specifically white subpixel, and the transmissive area TA, so as to reduce or minimize light transmittance loss caused by the black matrix BM.

The black matrix BM may include a material that absorbs light, for example, a black dye that fully absorbs light of a visible light wavelength range.

Hereinafter, an example that the first signal line SL1, the second signal line SL2, the driving transistor DT, and the capacitor Cst are disposed will be described in detail with reference to FIG. 4.

As described above, the display area DA includes a transmissive area TA and a non-transmissive area NTA. The transmissive area TA may have a rectangular shape that includes four corners. The transmissive area TA may include a first corner V1, a second corner V2 facing the first corner V1 in the second direction, a third corner V3 facing the second corner V2 in the first direction, and a fourth corner V4 facing the first corner V1 in the first direction.

The non-transmissive area NTA includes a first non-transmissive area NTA1 extended between adjacent transmissive areas TA in the first direction (e.g., X-axis direction), and a second non-transmissive area NTA2 extended between adjacent transmissive areas TA in the second direction (e.g., Y-axis direction).

The first signal line SL1, the driving transistor DT of each of the subpixels P1, P2, P3 and P4 and the first capacitor pattern portion CP1 of the capacitor Cst may be disposed in the first non-transmissive area NTA1. The second signal line SL2 and the second capacitor pattern portion CP2 of the capacitor Cst of each of the subpixels P1, P2, P3 and P4 may be disposed in the second non-transmissive area NTA2.

The transparent display panel 110 according to one embodiment of the present disclosure includes a capacitor Cst that includes an L shape. In detail, the capacitor Cst includes a first capacitor pattern portion CP1 and a second capacitor pattern portion CP2. The first capacitor pattern portion CP1 may be disposed between the first signal line SL1 and the transmissive area TA in the first non-transmissive area NTA1 and longitudinally provided in the first direction (e.g., X-axis direction). When the first signal line SL1 includes one scan line SCANL, the first capacitor pattern CP1 may be disposed between the scan line SCANL and the transmissive area TA.

The second capacitor pattern portion CP2 may be extended from one end of the first capacitor pattern portion CP1. The second capacitor pattern portion CP2 may be disposed between the second signal line SL2 and the transmissive area TA in the second non-transmissive area NTA2 and longitudinally provided in the second direction (e.g., Y-axis direction). When the second signal line SL2 includes a plurality of signal lines, the second capacitor pattern portion CP2 may be disposed between the signal line disposed at the outermost portion of the plurality of signal lines and the transmissive area TA.

The second capacitor pattern CP2 may have a width W2 smaller than a width W1 of the first capacitor pattern CP1. The portion CP2 extends perpendicular to the portion CP1 for a distance greater than the width of CP1. This will cause the capacitor Cst1 to include an L-shape. The first capacitor pattern portion CP1 may be provided along the first signal line SL1 in the first non-transmissive area NTA1, and the second capacitor pattern portion CP2 may be provided along the second signal line SL2 in the second non-transmissive area NTA2. At this time, the first signal line SL1 includes only the scan line SCANL, but the second signal line SL2 may include a large number of signal lines such as a first data line DL1, a second data line DL2, a pixel power line VDDL, a reference line REFL, a common power line VSSL, a third data line DL3, and a fourth data line DL4. Therefore, the width of the second signal line SL2 becomes greater than the width of the first signal line SL1.

In the transparent display panel 110 according to one embodiment of the present disclosure, the width W2 of the second capacitor pattern portion CP2 is smaller than the width W1 of the first capacitor pattern portion CP1, whereby the first non-transmissive area NTA1 and the second non-transmissive area NTA2 may be formed to be similar to each other by reducing a width difference therebetween.

In the transparent display panel 110 according to one embodiment of the present disclosure, the second and fourth subpixels P2 and P4 provided along the first non-transmissive area NTA1 and the first and third subpixels P1 and P3 provided along the second non-transmissive area NTA2 may be formed to have similar light emission areas. Therefore, in the transparent display panel 110 according to one embodiment of the present disclosure, a difference between a horizontal length and a vertical length of the transmissive area TA may be reduced, and beneficially, the transmissive area TA may be embodied in a square shape. The square shape has the shortest circumferential length among the squares having the same area. When the transmissive area TA is embodied in a square shape, the circumferential length of the transmissive area TA may be reduced or minimized. As described above, the transparent display panel 110 may include a black matrix BM between the subpixels P1, P2 and P4 and the transmissive area TA, and light transmittance is reduced as an area for forming the black matrix BM is increased.

In the transparent display panel 110 according to one embodiment of the present disclosure, the transmissive area TA is formed in a square shape, whereby the area for forming the black matrix BM may be reduced or minimized. Therefore, the transparent display panel 110 according to one embodiment of the present disclosure may improve light transmittance.

In addition, in the transparent display panel 110 according to one embodiment of the present disclosure, the transmissive area TA is formed in a square shape, whereby a diffraction phenomenon may be prevented from occurring in light passing through the transmissive area TA.

According to the diffraction phenomenon, light corresponding to plane waves may be changed to spherical waves as the light passes through the slit and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced.

This diffraction phenomenon may occur when the external light passes through the slit, elongated linear or rectangular transmissive area TA. The transparent display panel 110 according to one embodiment of the present disclosure may form the transmissive area TA in a square shape, thereby preventing a diffraction phenomenon from occurring, and improving definition of image quality.

Meanwhile, the capacitor Cst including the first capacitor pattern portion CP1 and the second capacitor pattern portion CP2 and the driving transistor DT may be provided for each of the subpixels P1, P2, P3 and P4.

The capacitor Cst may include a first capacitor Cst1 connected with the first subpixel P1, a second capacitor Cst2 connected with the second subpixel P2, a third capacitor Cst3 connected with the third subpixel P3, and a fourth capacitor Cst4 connected with the fourth subpixel P4. Each of the capacitors Cst1, Cst2, Cst3 and Cst4 contain a first portion that extends perpendicular to a second portion for a distance greater than the width of the first portion (for instance, as shown in FIG. 4, the second portion CP2 extends perpendicular, in the Y-axis direction, for a distance greater than the width W1 of the first portion of the first capacitor Cst1). This will cause each of these capacitors to have at least one plate that includes an L-shape. In some embodiments, both plates of each capacitor Cst1-Cst4 will have the same shape that includes the L-shape. However, in some embodiments, one of the plates might have a somewhat different shape than the other plate and such capacitors still fall within the inventive concepts of this disclosure.

In addition, the driving transistor DT may include a first driving transistor DT1 connected with the first subpixel P1, a second driving transistor DT2 connected with the second subpixel P2, a third driving transistor DT3 connected with the third subpixel P3, and a fourth driving transistor DT4 connected with the fourth subpixel P4.

The first capacitor Cst1 may be disposed to correspond to the first corner V1 of each of the plurality of transmissive areas TA, and may be formed in an L-shape along an outer portion of the transmissive area TA. In detail, the first capacitor pattern portion CP1 of the first capacitor Cst1 may be disposed between the first signal line SL1 and the transmissive area TA at a first side of the first signal line SL1. The first capacitor pattern portion CP1 of the first capacitor Cst1 may be formed along the outer portion from the first corner V1 of the transmissive area TA toward the fourth corner V4.

The second capacitor pattern portion CP2 of the first capacitor Cst1 may be disposed between the second signal line SL2 and the transmissive area TA at the first side of the first signal line SL1. The second capacitor pattern portion CP2 of the first capacitor Cst1 may be bent at one end of the first capacitor pattern portion CP1, and may be formed along the outer portion from the first corner V1 of the transmissive area TA toward the second corner V2.

The first capacitor Cst1 may be connected with the first electrode 120 of the first subpixel P1 through a first contact electrode CT1 protruded from the second capacitor pattern portion CP2 toward the transmissive area TA.

Meanwhile, the first driving transistor DT1 may be spaced apart from the second signal line SL2 in the first non-transmissive area NTA1 with the first capacitor Cst interposed between the first driving transistor DT1 and the second signal line SL2. Therefore, the first driving transistor DT1 connected with the first subpixel P1 may be spaced apart from the first subpixel P1 with the first capacitor Cst1 interposed between the first driving transistor DT1 and the first subpixel P1, and may overlap at least one of the second subpixel P2 and the fourth subpixel P4. For example, the first driving transistor DT1 may overlap at least a part of the second subpixel P2.

The first driving transistor DT1 may be disposed between the first signal line SL1 and the transmissive area TA and thus connected with the other end of the first capacitor pattern portion CP1 of the first capacitor Cst1. The gate electrode GE of the first driving transistor DT1 may be formed to be extended from the first capacitor electrode CE1 provided in the first capacitor pattern portion CP1 of the first capacitor Cst1. The source electrode SE or the drain electrode DE of the first driving transistor DT1 may be formed to be extended from the second capacitor electrode CE2 of the first capacitor pattern portion CP1 of the first capacitor Cst1. The first driving transistor DT1 may electrically be connected with the first electrode 120 of the first subpixel P1 through the first capacitor Cst1 and the first contact electrode CT1.

The second capacitor Cst2 may be disposed to correspond to the second corner V2 of each of the plurality of transmissive areas TA, and may be formed to be symmetrical with the first capacitor Cst1. In detail, the first capacitor pattern portion CP1 of the second capacitor Cst2 may be disposed between the first signal line SL1 and the transmissive area TA at a second side of the first signal line SL1. The first capacitor pattern portion CP1 of the second capacitor Cst2 may be formed along the outer portion from the second corner V2 of the transmissive area TA toward the third corner V3. At this time, the first capacitor pattern portion CP1 of the second capacitor Cst2 may be provided to be symmetrical with the first capacitor pattern portion CP1 of the first capacitor Cst1 based on the first signal line SL1.

The second capacitor pattern portion CP2 of the second capacitor Cst2 may be disposed between the second signal line SL2 and the transmissive area TA at the second side of the first signal line SL1. The second capacitor pattern portion CP2 of the second capacitor Cst2 may be bent at one end of the first capacitor pattern portion CP1, and may be formed along the outer portion from the second corner V2 of the transmissive area TA toward the first corner V1.

The second capacitor Cst2 may be connected with the first electrode 120 of the second subpixel P2 through a second contact electrode CT2 protruded from the first capacitor pattern portion CP1 toward the transmissive area TA.

Meanwhile, the second driving transistor DT2 may be spaced apart from the second signal line SL2 in the first non-transmissive area NTA1 with the second capacitor Cst2 interposed between the second driving transistor DT2 and the second signal line SL2. The second driving transistor DT2 connected with the second subpixel P2 may overlap at least a part of the second subpixel P2.

The second driving transistor DT2 may be disposed to be symmetrical with the first driving transistor DT1 based on the first signal line SL1, and may be connected with the other end of the first capacitor pattern portion CP1 of the second capacitor Cst2. The gate electrode GE of the second driving transistor DT2 may be formed to be extended from the first capacitor electrode CE1 provided in the first capacitor pattern portion CP1 of the second capacitor Cst2. The source electrode SE or the drain electrode DE of the second driving transistor DT2 may be formed to be extended from the second capacitor electrode CE2 provided in the first capacitor pattern portion CP1 of the second capacitor Cst2. The second driving transistor DT2 may electrically be connected with the first electrode 120 of the second subpixel P2 through the second capacitor Cst2 and the second contact electrode CT2.

The third capacitor Cst3 may be disposed to correspond to the third corner V3 of each of the plurality of transmissive areas TA, and may be formed to be symmetrical with the second capacitor Cst2. In detail, the first capacitor pattern portion CP1 of the third capacitor Cst3 may be disposed between the first signal line SL1 and the transmissive area TA at the second side of the first signal line SL1. The first capacitor pattern portion CP1 of the third capacitor Cst3 may be formed along the outer portion from the third corner V3 of the transmissive area TA toward the second corner V2. At this time, the first capacitor pattern portion CP1 of the third capacitor Cst3 may be provided to be symmetrical with the first capacitor pattern portion CP1 of the second capacitor Cst2 based on the second signal line SL2.

The second capacitor pattern CP2 of the third capacitor Cst3 may be disposed between the second signal line SL2 and the transmissive area TA at the second side of the first signal line SL1. The second capacitor pattern portion CP2 of the third capacitor Cst3 may be bent at one end of the first capacitor pattern portion CP1, and may be formed along the outer portion from the third corner V3 of the transmissive area TA toward the fourth corner V4.

The third capacitor Cst3 may be connected with the first electrode 120 of the third subpixel P3 through a third contact electrode CT3 protruded from the second capacitor pattern portion CP2 toward the transmissive area TA.

Meanwhile, the third driving transistor DT3 may be spaced apart from the second signal line SL2 in the first non-transmissive area NTA1 with the third capacitor Cst3 interposed between the third driving transistor DT3 and the second signal line SL2. Therefore, the third driving transistor DT3 connected with the third subpixel P3 may be spaced apart from the third subpixel P3 with the third capacitor Cst3 interposed between the third driving transistor DT3 and the third subpixel P3, and may overlap at least one of the second subpixel P2 or the fourth subpixel P4. For example, the third driving transistor DT3 may overlap at least a part of the fourth subpixel P4.

The third driving transistor DT3 may be disposed to be symmetrical with the second driving transistor DT2 based on the second signal line SL2, and may be connected with the other end of the first capacitor pattern portion CP1 of the third capacitor Cst3. The gate electrode GE of the third driving transistor DT3 may be formed to be extended from the first capacitor electrode CE1 provided in the first capacitor pattern portion CP1 of the third capacitor Cst3. The source electrode SE or the drain electrode DE of the third driving transistor DT3 may be formed to be extended from the second capacitor electrode CE2 provided in the first capacitor pattern portion CP1 of the third capacitor Cst3. The third driving transistor DT3 may electrically be connected with the first electrode 120 of the third subpixel P3 through the third capacitor Cst3 and the third contact electrode CT3.

The fourth capacitor Cst4 may be disposed to correspond to the fourth corner V4 of each of the plurality of transmissive areas TA, and may be formed to be symmetrical with the third capacitor Cst3. In detail, the first capacitor pattern portion CP1 of the fourth capacitor Cst4 may be disposed between the first signal line SL1 and the transmissive area TA at the first side of the first signal line SL1. The first capacitor pattern portion CP1 of the fourth capacitor Cst4 may be formed along the outer portion from the fourth corner V4 of the transmissive area TA toward the first corner V1. At this time, the first capacitor pattern portion CP1 of the fourth capacitor Cst4 may be provided to be symmetrical with the first capacitor pattern portion CP1 of the third capacitor Cst3 based on the first signal line SL1.

The second capacitor pattern portion CP2 of the fourth capacitor Cst4 may be disposed between the second signal line SL2 and the transmissive area TA at the first side of the first signal line SL1. The second capacitor pattern portion CP2 of the fourth capacitor Cst4 may be bent at one end of the first capacitor pattern portion CP1, and may be formed along the outer portion from the fourth corner V4 of the transmissive area TA toward the third corner V3.

The fourth capacitor Cst4 may be connected with the first electrode 120 of the fourth subpixel P4 through a fourth contact electrode CT4 protruded from the first capacitor pattern portion CP1 toward the transmissive area TA.

Meanwhile, the fourth driving transistor DT4 may be spaced apart from the second signal line SL2 in the first non-transmissive area NTA1 with the fourth capacitor Cst4 interposed between the fourth driving transistor DT4 and the second signal line SL2. The fourth driving transistor DT4 connected with the fourth subpixel P4 may overlap at least a part of the fourth subpixel P4.

The fourth driving transistor DT4 may be disposed to be symmetrical with the third driving transistor DT3 based on the first signal line SL1, and may be connected with the other end of the first capacitor pattern portion CP1 of the fourth capacitor Cst4. The gate electrode GE of the fourth driving transistor DT4 may be formed to be extended from the first capacitor electrode CE1 provided in the first capacitor pattern portion CP1 of the fourth capacitor Cst4. The source electrode SE or the drain electrode DE of the fourth driving transistor DT4 may be formed to be extended from the second capacitor electrode CE2 provided in the first capacitor pattern portion CP1 of the fourth capacitor Cst4. The fourth driving transistor DT4 may electrically be connected with the first electrode 120 of the fourth subpixel P4 through the fourth capacitor Cst4 and the fourth contact electrode CT4.

In the transparent display panel 110 according to one embodiment of the present disclosure, the first to fourth driving transistors DT1, DT2, DT3 and DT4 may be disposed to be symmetrical with each other. In detail, the first driving transistor DT1 of the first subpixel P1 may be symmetrical with the second driving transistor DT2 of the second subpixel P2 based on the first axis (e.g., X-axis). The third driving transistor DT3 of the third subpixel P3 may be symmetrical with the fourth driving transistor DT4 of the fourth subpixel P4 based on the first axis (e.g., X-axis). The first driving transistor DT1 of the first subpixel P1 and the second driving transistor DT2 of the second subpixel P2 may be symmetrical with the third driving transistor DT3 of the third subpixel P3 and the fourth driving transistor DT4 of the fourth subpixel P4 based on the second axis (e.g., Y-axis).

In addition, in the transparent display panel 110 according to one embodiment of the present disclosure, the first to fourth capacitors Cst1, Cst2, Cst3 and Cst4 may be disposed to be symmetrical with each other. In detail, the first capacitor Cst1 of the first subpixel P1 may be symmetrical with the second capacitor Cst2 of the second subpixel P2 based on the first axis (e.g., X-axis). The third capacitor Cst3 of the third subpixel P3 may be symmetrical with the fourth capacitor Cst4 of the fourth subpixel P4 based on the first axis (e.g., X-axis). The first capacitor Cst1 of the first subpixel P1 and the second capacitor Cst2 of the second subpixel P2 may be symmetrical with the third capacitor Cst3 of the third subpixel P3 and the fourth capacitor Cst4 of the fourth subpixel P4 based on the second axis (e.g., Y-axis).

In the transparent display panel 110 according to one embodiment of the present disclosure, the driving transistor DT of each of the first to fourth subpixels P1, P2, P3 and P4 and the first capacitor pattern portion CP1 of the capacitor Cst may be provided between areas, in which at least a part of the first non-transmissive area NTA1 and at least a part of the second non-transmissive area NTA2 overlap each other, in the first non-transmissive area NTA1. That is, in the transparent display panel 110 according to one embodiment of the present disclosure, the driving transistor DT is not provided in the second non-transmissive area NTA2. Therefore, in the transparent display panel 110 according to one embodiment of the present disclosure, the driving transistor DT is spaced apart from the second signal line SL2, especially the pixel power line VDDL and the common power line VSSL, whereby parasitic capacitance may not occur between the driving transistor DT and the second signal line SL2, or may be reduced or minimized.

In addition, in the transparent display panel 110 according to one embodiment of the present disclosure, the second capacitor pattern portion CP2 of the capacitor Cst may be provided in the second non-transmissive area NTA2, but may be thinner than the first capacitor pattern portion CP1. Therefore, the transparent display panel 110 according to one embodiment of the present disclosure may reduce or minimize the width of the second non-transmissive area NTA2 and improve light transmittance.

In addition, in the transparent display panel 110 according to one embodiment of the present disclosure, the capacitor Cst has an L-shape. Therefore, even though the driving transistor DT of each of the first to fourth subpixels P1, P2, P3 and P4 is disposed in the first non-transmissive area NTA1, the driving transistor DT may be connected with the first electrode 120 of the subpixels P1 and P3 disposed in the second non-transmissive area NTA2.

Particularly, in the transparent display panel 110 according to one embodiment of the present disclosure, the first capacitor pattern portion CP1 and the second capacitor pattern portion CP2 of the capacitor Cst may be provided along the outer portion of the transmissive area TA, whereby the degree of freedom in design of the contact electrode CT for connection with the first electrode 120 of each of the first to fourth subpixels P1, P2, P3 and P4 may be improved.

In addition, in the transparent display panel 110 according to one embodiment of the present disclosure, the capacitor Cst does not overlap the first signal line SL1 and the second signal line SL2. Particularly, in the transparent display panel 110 according to one embodiment of the present disclosure, the capacitor Cst is not provided between the plurality of signal lines included in the second signal line SL2, whereby parasitic capacitance caused by the signal lines may be reduced or minimized.

Meanwhile, in the transparent display panel 110 according to one embodiment of the present disclosure, four driving transistors DT1, DT2, DT3 and DT4 may be disposed together. In detail, the driving transistors DT1 and DT2 of the first subpixel P1 and the second subpixel P1 of one pixel P and the driving transistors DT3 and DT4 of the third subpixel P3 and the fourth subpixel P4 of another pixel P adjacent to one pixel in the first direction may be disposed together. In this case, since the spaced distance between the four driving transistors DT1, DT2, DT3 and DT4 is not large, the pixel power lines VDDL for supplying the first power source to each of the four driving transistors DT1, DT2, DT3 and DT4 may be connected with each other to form a mesh structure.

Hereinafter, the pixel power lines VDDL having a mesh structure will be described in detail with reference to FIGS. 7 and 8.

Figure 7:
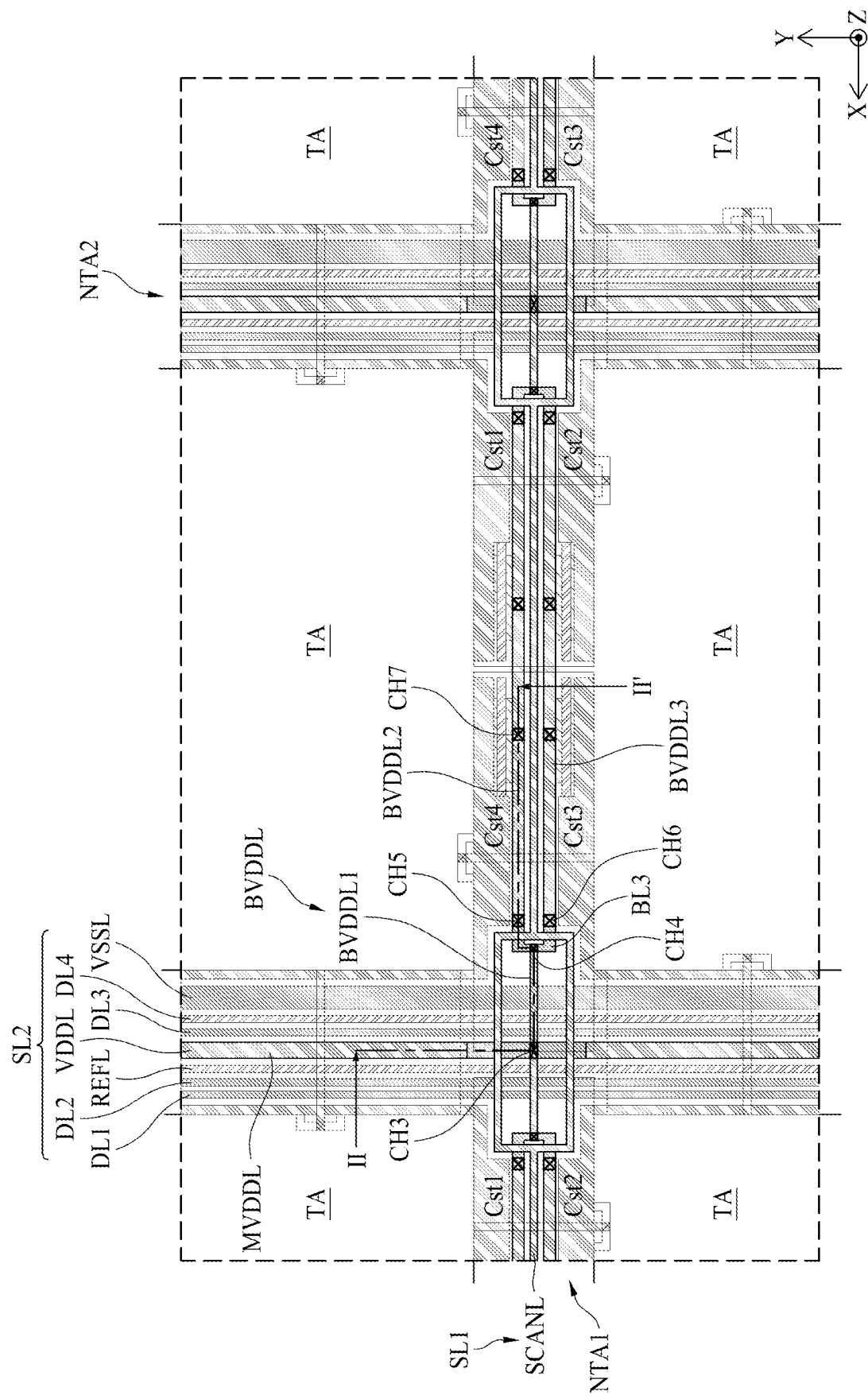
FIG. 7 is a view illustrating an example of pixel power lines having a mesh structure.
Figure 8:
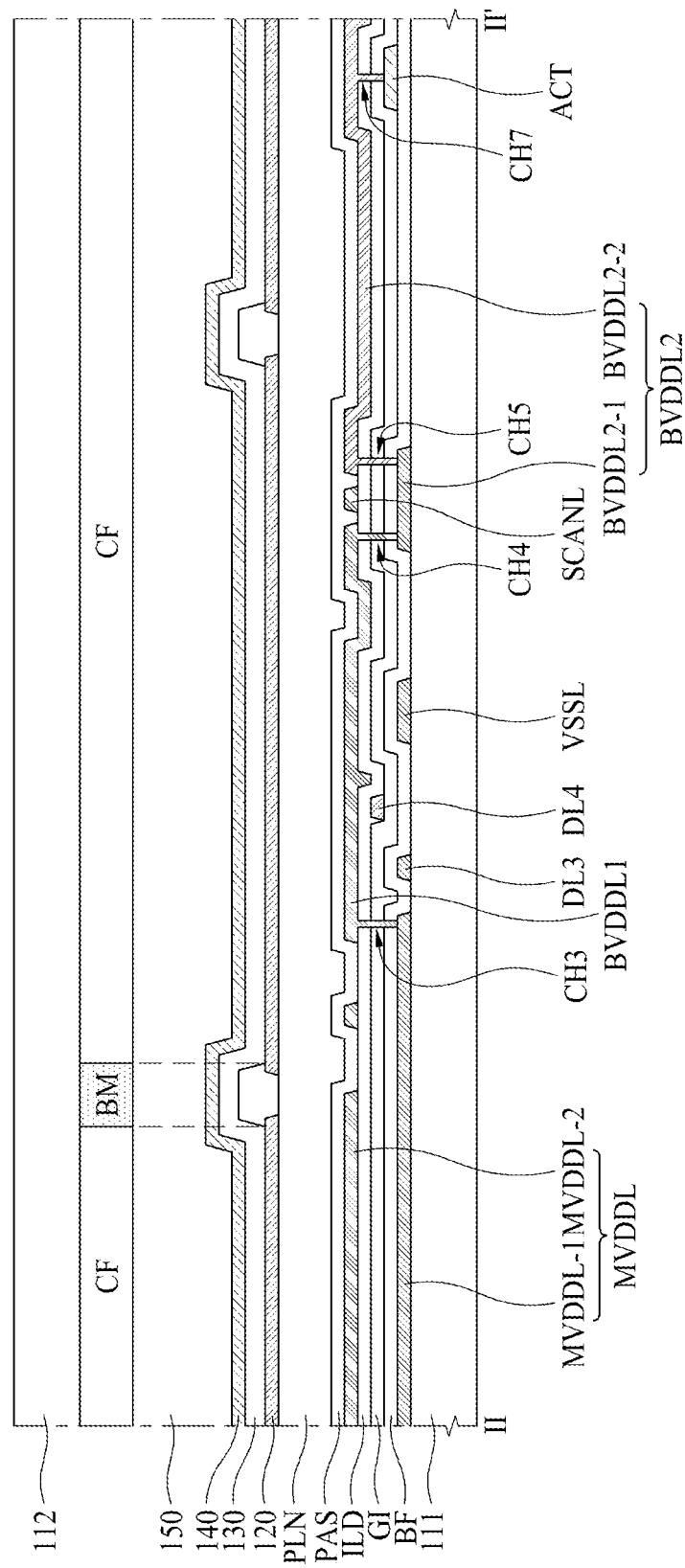
FIG. 8 is a cross-sectional view taken along line II-IF of FIG. 7.

FIG. 7 is a view illustrating an example of pixel power lines having a mesh structure, and FIG. 8 is a cross-sectional view taken along line II-IP of FIG. 7.

Referring to FIGS. 7 and 8, the pixel power line VDDL may include a main pixel power supply line MVDDL and a branch pixel power supply line BVDDL.

The main pixel power supply line MVDDL may be extended from the second non-transmissive area NTA2 in the second direction. The main pixel power supply line MVDDL may be formed as a double layer to make sure of a wide area. For example, the main pixel power supply line VDDL may include a first pixel power line VDDL-1 and a second pixel power line VDDL-2 provided over the first pixel power line VDDL-1, as shown in FIG. 8. For example, the first pixel power line VDDL-1 may be formed on the same layer as the light-shielding layer LS, and the second pixel power line VDDL-2 may be formed on the same layer as the source electrode SE or the drain electrode DE. The first pixel power line VDDL-1 and the second pixel power line VDDL-2 may electrically be connected with each other through a plurality of contact holes.

The branch pixel power supply line BVDDL may be branched from the main pixel power supply line MVDDL and extend from the first non-transmissive area NTA1 in the first direction. At this time, the branch pixel power supply line BVDDL may connect the main pixel power supply lines MVDDL, which are adjacent to each other in the first direction, with each other.

The branch pixel power supply line BVDDL may include a plurality of lines to connect the main pixel power supply lines MVDDL, which are adjacent to each other in the first direction, with each other. In detail, the branch pixel power supply line BVDDL may include a first branch pixel power supply line BVDDL1, a second branch pixel power supply line BVDDL2, and a third branch pixel power supply line BVDDL3.

The first branch pixel power supply line BVDDL1 may be disposed in an area where at least a part of the first non-transmissive area NTA1 and at least a part of the second non-transmissive area NTA2 overlap each other, and may be extended in the first direction to partially overlap the main pixel power supply line MVDDL. The first branch pixel power supply line BVDDL1 may be connected to the main pixel power supply line MVDDL through a third contact hole CH3. For example, the first branch pixel power supply line BVDDL1 may be formed on the same layer as the source electrode SE or the drain electrode DE, and the second pixel power line VDDL-2 may form an open area in the area where at least a part of the first non-transmissive area NTA1 and at least a part of the second non-transmissive area NTA2 overlap each other. In this case, the first branch pixel power supply line BVDDL1 may be connected to the first pixel power line VDDL-1 of the main pixel power supply line MVDDL provided on the same layer as the light-shielding layer LS through the third contact hole CH3.

The second branch pixel power supply line BVDDL2 and the third branch pixel power supply line BVDDL3 may connect the first branch pixel power supply lines BVDDL1, which are adjacent to each other in the first direction, with each other. The second branch pixel power supply line BVDDL2 may be formed on one or more layers, so as to be connected with the first branch pixel power supply line BVDDL1, and may have a structure connected with the first branch pixel power supply line BVDDL1 through a contact hole. For example, the second branch pixel power supply line BVDDL2 may include a first line BVDDL2-1 formed on the same layer as the light-shielding layer LS in an area crossing the scan line SCANL, and a second line BVDDL2-2 formed on the same layer as the source electrode SE or the drain electrode DE and extended in parallel with the scan line SCANL. The first line BVDDL2-1 may be connected with the first branch pixel power supply line BVDDL1 at one end through a fourth contact hole CH4, and may be connected with the second line BVDDL2-2 at the other end through a fifth contact hole CH5. At this time, the second line BVDDL2-2 may be disposed at the first side of the scan line SCANL, and may be connected with the active layer ACT of the driving transistor DT disposed at the first side of the scan line SCANL through a seventh contact hole CH7. The second line BVDDL2-2 may transfer a first power source supplied from the main pixel power supply line MVDDL, to the driving transistor DT disposed at the first side of the scan line SCANL.

The third branch pixel power supply line BVDDL3 may also be formed on one or more layers, so as to be connected with the first branch pixel power supply line BVDDL1, and may have a structure connected with the first branch pixel power supply line BVDDL1 through a contact hole. For example, the third branch pixel power supply line BVDDL3 may include a first line formed on the same layer as the light-shielding layer LS in an area crossing the scan line SCANL, and a second line formed on the same layer as the source electrode SE or the drain electrode DE and extended in parallel with the scan line SCANL. The first line may be connected with the first branch pixel power supply line BVDDL1 at one end through the fourth contact hole CH4, and may be connected with the second line at the other end through a sixth contact hole CH6. At this time, the second line may be disposed at the second side of the scan line SCANL, and may be connected with the active layer ACT of the driving transistor DT disposed at the second side of the scan line SCANL through a contact hole. The second line may transfer the first power source supplied from the main pixel power supply line MVDDL, to the driving transistor DT disposed at the second side of the scan line SCANL.

In the transparent display panel 110 according to one embodiment of the present disclosure, the pixel power line VDDL may include a main pixel power supply line MVDDL extended from the second non-transmissive area NTA2 in the second direction, and a branch pixel power supply line BVDDL extended from the first non-transmissive area NTA1 in the first direction to connect the main pixel power supply lines MVDDL, which are adjacent to each other in the first direction, with each other. That is, in the transparent display panel 110 according to one embodiment of the present disclosure, the pixel power lines VDDL may have a mesh structure such that voltages of the pixel power lines VDDL may uniformly be distributed, whereby luminance uniformity of the subpixels P1, P2, P3 and P4 may be improved. In addition, in the transparent display panel 110 according to one embodiment of the present disclosure, a size of the pixel power line VDDL may be increased to reduce resistance, whereby a voltage drop may be reduced.

According to the present disclosure, the following advantageous effects may be obtained.

In the present disclosure, the circuit areas of the subpixels are not disposed between the plurality of signal lines, whereby parasitic capacitance caused by the signal lines may be reduced or minimized and the size of the non-transmissive area may be reduced. Particularly, in the present disclosure, all the driving transistors of the subpixels may be disposed in the first non-transmissive area of which signal lines are less than those of the second non-transmissive area, whereby the size of the second non-transmissive area may be reduced.

In addition, in the present disclosure, as the capacitor of the subpixels is formed in an L-shape, even though all the driving transistors of the subpixels are disposed in the first non-transmissive area, the first electrode of the subpixels disposed in the second non-transmissive area may be connected with the driving transistor.

In addition, since the capacitor is formed in an L-shape along the outer portion of the transmissive area, the degree of freedom in design for the contact electrode for contact with the first electrode of each of the subpixels may be improved.

In addition, in the present disclosure, the second capacitor pattern portion provided in the second non-transmissive area may be formed to be thinner than the first capacitor pattern portion provided in the first non-transmissive area, whereby the width difference between the first non-transmissive area and the second non-transmissive area may be reduced or minimized. Therefore, in the present disclosure, the subpixels provided in the first non-transmissive area and the subpixels provided in the second non-transmissive area have similar light emission areas, and the transmissive area may be formed in a square shape. In the present disclosure, as the transmissive area is formed in a square shape, an area for forming the black matrix may be reduced or minimized and light transmittance may be improved. In addition, in the present disclosure, a diffraction phenomenon may be prevented from occurring in light passing through the transmissive area, and definition of image quality may be improved.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
   transmissive areas and a non-transmissive area disposed between the transmissive areas;
   a plurality of subpixels in the non-transmissive area;
   a first signal line extended between the transmissive areas in a first direction;
   a second signal line extended between the transmissive areas in a second direction; and
   a capacitor including a first capacitor pattern portion longitudinally provided between the first signal line and the transmissive area in the first direction and a second capacitor pattern portion extended from one end of the first capacitor pattern portion and longitudinally provided between the second signal line and the transmissive area in the second direction.

2. The display device of claim 1, wherein the second signal line includes a plurality of signal lines, and the second capacitor pattern portion of the capacitor is disposed between a signal line, which is disposed at an outermost portion among the plurality of signal lines, and the transmissive area.

3. The display device of claim 1, wherein the capacitor includes:
   a first capacitor having the first capacitor pattern portion disposed between the first signal line and the transmissive area at a first side of the first signal line, coupled with a first subpixel;
   a second capacitor disposed at a second side of the first signal line, provided to be symmetrical with the first capacitor based on the first signal line and coupled with a second subpixel;
   a third capacitor provided to be symmetrical with the second capacitor based on the second signal line and coupled with a third subpixel; and
   a fourth capacitor provided to be symmetrical with the first capacitor based on the second signal line and coupled with a fourth subpixel.

4. The display device of claim 3, wherein the second subpixel and the fourth subpixel are alternately disposed along the first signal line, and the first subpixel and the third subpixel are alternately disposed along the second signal line.

5. The display device of claim 3, wherein each of the plurality of subpixels includes a first electrode, a light emitting layer, and a second electrode, and further includes a contact electrode protruded from the capacitor and coupled with the first electrode of the subpixel.

6. The display device of claim 5, wherein each of the first capacitor and the third capacitor is protruded from the second capacitor pattern portion toward the transmissive area to form the contact electrode, and each of the second capacitor and the fourth capacitor is protruded from the first capacitor pattern portion toward the transmissive area to form the contact electrode.

7. The display device of claim 1, wherein the capacitor does not overlap the first signal line and the second signal line.

8. The display device of claim 1, wherein the second capacitor pattern portion has a width narrower than that of the first capacitor pattern portion.

9. The display device of claim 3, wherein at least one of the first, second, third, and fourth capacitor includes an L-shape.

10. The display device of claim 1, wherein the first signal line is a scan line, and the second signal line includes at least one of a data line, a pixel power line, a reference line, or a common power line.

11. The display device of claim 1, wherein the second signal line includes a main pixel power supply line extended between the transmissive areas in the second direction, and the first signal line includes a branch pixel power supply line extended between the transmissive areas in the first direction, coupling adjacent main pixel power supply lines with each other in the first direction.

12. The display device of claim 1, wherein the non-transmissive area includes a first non-transmissive area provided with the first signal line and second and fourth subpixels alternately disposed along the first signal line, and a second non-transmissive area provided with the second signal line and first and third subpixels alternately disposed along the second signal line, the transparent display device further comprising first to fourth driving transistors provided in the first non-transmissive area and respectively coupled with the first to fourth subpixels.

13. The display device of claim 12, wherein the first driving transistor connected with the first subpixel is spaced apart from the first subpixel in the non-transmissive area with the capacitor interposed therebetween, and the third driving transistor coupled with the third subpixel is spaced apart from the third subpixel with the capacitor interposed therebetween.

14. The display device of claim 13, wherein each of the first driving transistor coupled with the first subpixel and the third driving transistor coupled with the third subpixel overlaps at least one of the second subpixel or the fourth subpixel.

15. The display device of claim 12, wherein each of the first to fourth driving transistors is spaced apart from the second signal line with the capacitor interposed therebetween.

16. The display device of claim 12, wherein each of the first to fourth driving transistors includes an active layer, a gate electrode, a source electrode, and a drain electrode,
wherein each of the first capacitor pattern portion and the second capacitor pattern portion of the capacitor includes a first capacitor electrode and a second capacitor electrode provided over the first capacitor electrode,
wherein the gate electrode is provided to be extended from the first capacitor electrode provided in the first capacitor pattern portion of the capacitor, and
wherein the source electrode or the drain electrode is provided to be extended from the second capacitor electrode provided in the first capacitor pattern portion of the capacitor.

17. A display device comprising:
a first transmissive area;
a second transmissive area spaced apart and opposite the first transmissive area in a first direction;
a third transmissive area spaced apart and opposite the first transmissive area in a second direction transverse to the first direction;
a fourth transmissive area between the second and third transmissive areas;
non-transmissive areas between a space between the first, second, third, and fourth transmissive areas;
a plurality of subpixels in the non-transmissive area;
a first capacitor electrode having a first capacitor portion extending in the first direction and a second capacitor portion extending in the second direction that is perpendicular to the first direction, the first capacitor portion being continuous and contiguous to the second capacitor portion; and
a first signal line extending in the first direction in the non-transmissive area;
wherein the first capacitor portion is between the first transmissive area and the first signal line.

18. The display device of claim 17, further comprising:
a second capacitor electrode having a first capacitor portion extending in the first direction and a second capacitor portion extending in the second direction, the first capacitor portion being continuous and contiguous to the second capacitor portion;
wherein the second capacitor electrode is symmetrically arranged from the first capacitor electrode with respect to the first signal line, and
wherein the first capacitor portion of the second capacitor electrode and the second capacitor portion of the second capacitor electrode are adjacent to the third transmissive area.

19. The display device of claim 17, wherein the first capacitor portion has a first dimension in the second direction and the second capacitor portion has a second dimension in the first direction,
wherein the first dimension is greater than the second dimension.

20. The display device of claim 17, further comprising a first driving transistor including an active layer, a drain electrode, a source electrode, and a gate electrode, the first driving transistor adjacent to the first capacitor electrode,
wherein either the drain electrode or the source electrode of the first driving transistor includes the first capacitor electrode, and
wherein the first driving transistor is spaced apart from the first signal line.

21. The display device of claim 20, further comprising a third capacitor electrode below the first capacitor electrode,
wherein the third capacitor electrode extends to overlap with the drain, source, and gate electrodes and the active layer of the driving transistor,
wherein an overlapping area of the third capacitor electrode with the first driving transistor is a light shielding layer for the first driving transistor, and
wherein a non-overlapping area of the third capacitor electrode with the first driving transistor forms capacitance based on the first capacitor electrode and the third capacitor electrode.

* * * * *